(12) United States Patent
Kim et al.

(10) Patent No.: US 9,064,591 B2
(45) Date of Patent: Jun. 23, 2015

(54) SEMICONDUCTOR DEVICE WITH OTP MEMORY CELL

(75) Inventors: Tae Hoon Kim, Seongnam-si (KR); Sung Mook Kim, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 313 days.

(21) Appl. No.: 13/613,229

(22) Filed: Sep. 13, 2012

(65) Prior Publication Data

US 2013/0077376 A1      Mar. 28, 2013

(30) Foreign Application Priority Data

Sep. 23, 2011   (KR) ........................ 10-2011-0096041

(51) Int. Cl.
  *G11C 17/16*    (2006.01)
  *G11C 17/18*    (2006.01)
(52) U.S. Cl.
  CPC ................ *G11C 17/18* (2013.01); *G11C 17/16* (2013.01)

(58) Field of Classification Search
  CPC ................................ G11C 17/16; G11C 17/18
  USPC .......................... 365/63, 103, 104, 96, 225.7
  See application file for complete search history.

(56) References Cited

U.S. PATENT DOCUMENTS

| 6,667,902 B2 | 12/2003 | Peng |
| 6,822,888 B2 * | 11/2004 | Peng ............................... 365/63 |
| 2002/0021605 A1 * | 2/2002 | Harada et al. ................. 365/201 |
| 2004/0037127 A1 * | 2/2004 | Lindhorst et al. ............. 365/202 |

* cited by examiner

*Primary Examiner* — Thao H Bui
(74) *Attorney, Agent, or Firm* — William Park & Associates Ltd.

(57) ABSTRACT

A semiconductor device with OTP memory cell includes a first switching unit for transferring a first bias voltage, a first MOS transistor having a first gate coupled to a first gate signal and a first terminal coupled to the first bias voltage by the first switching unit, and a second switching unit for coupling a second terminal of the first MOS transistor to a first bit line.

21 Claims, 9 Drawing Sheets

< Initial OTP cell >

< Programmed OTP cell >

< Program operation >

< Read operation >

< Initial OTP cell >

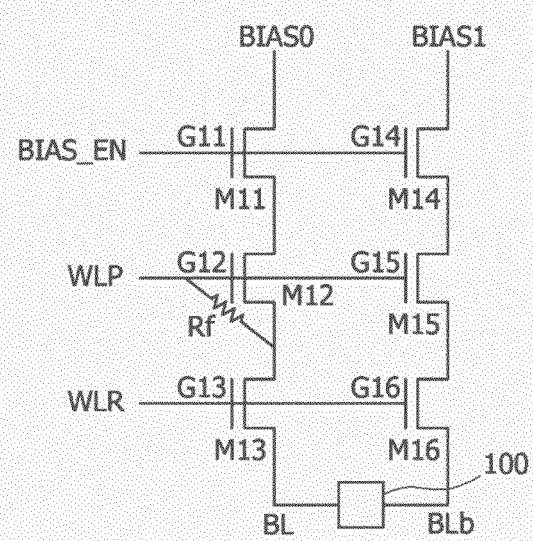

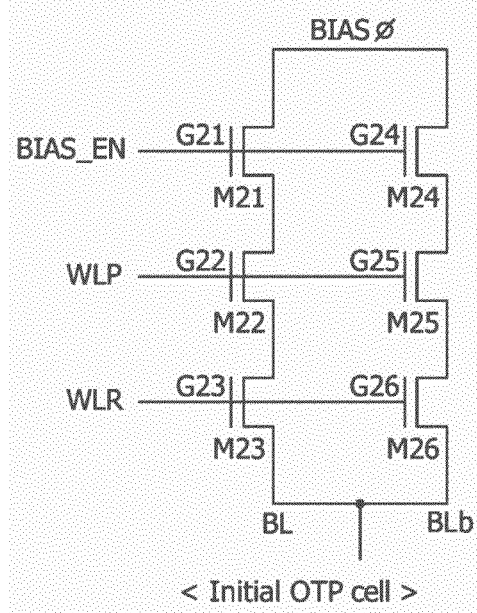

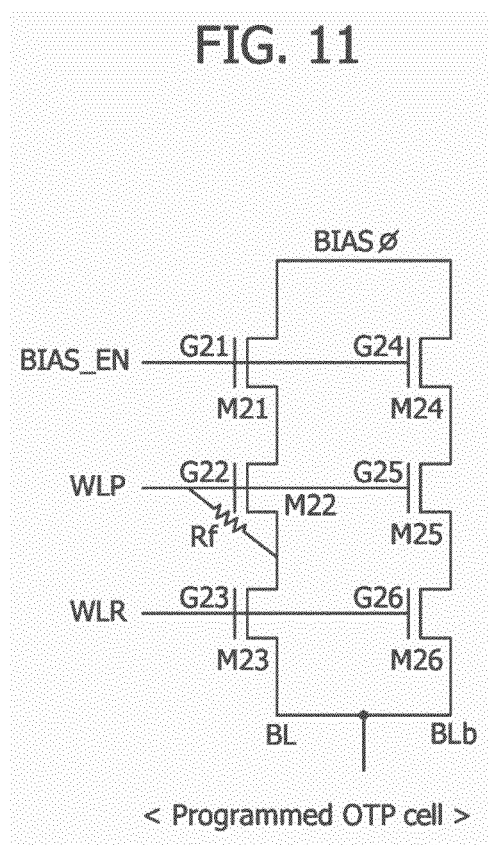

SEMICONDUCTOR DEVICE WITH OTP MEMORY CELL

CROSS-REFERENCE(S) TO RELATED APPLICATIONS

The present application claims priority under 35 U.S.C. 119(a) to Korean Patent Application No. 10-2011-0096041, filed on Sep. 23, 2011 in the Korean intellectual property office, which is incorporated herein by reference in its entirety.

BACKGROUND OF THE INVENTION

1. Field of the Invention

The present invention relates to a semiconductor device, and more particularly to a semiconductor memory device including one-time programmable (OTP) memory cells.

2. Description of the Related Art

A semiconductor memory device is a storage device which stores data and reads the data when the data is needed. The semiconductor memory device is generally divided into two categories: a random access memory (RAM) and a read only memory (ROM). The ROM is a nonvolatile memory which can retain data even if power is off. The ROM includes a programmable read only memory (PROM), an erasable programmable read only memory (EPROM), an electrically erasable programmable read only memory (EEPROM), a flash memory device, etc. The RAM is a volatile memory which cannot retain data when power is off. The RAM includes a dynamic random access memory (DRAM), a static random access memory (SRAM), etc. Aside from these memory devices, an innovative semiconductor memory device using nonvolatile materials instead of capacitors used in a DRAM has been developed. The innovative semiconductor memory device includes a ferroelectric random access memory (FRAM) using ferroelectric capacitors, or a magnetic random access memory (MRAM) using a tunneling magneto-resistive (TMR) layer.

One time programmable (OTP) cells can be programmed only one time. A memory block including OTP memory cells is typically used for storing trimming integrated circuit information, security identification information, chip identification information, calibration data, or storing main memory block redundancy information. As systems including integrated circuits become more technologically sophisticated or operationally complex, a memory block including OTP memory cells requires a higher operation speed.

SUMMARY OF THE INVENTION

An embodiment of the present invention is directed to a memory device including one-time programmable (OTP) memory cells which can be accessed at high speed.

In accordance with an embodiment of the present invention, a semiconductor device with OTP memory cell includes a first switching unit for transferring a first bias voltage, a first MOS transistor having a first gate coupled to a first gate signal and a first terminal coupled to the first bias voltage by the first switching unit, and a second switching unit for coupling a second terminal of the first MOS transistor to a first bit line.

In accordance with another embodiment of the present invention, a semiconductor device with OTP memory cells includes a first switching unit for transferring a first bias voltage, a first MOS transistor having a first gate coupled to a first gate signal and a first terminal coupled to the first bias voltage by the first switching unit, a second switching unit for coupling a second terminal of the first MOS transistor to a first bit line, a third switching unit for transferring a second bias voltage, a second MOS transistor having a second gate coupled to the first gate signal and a first terminal coupled to the second bias voltage by the third switching unit, a fourth switching unit for coupling a second terminal of the second MOS transistor to a second bit line, and a sense amplifier for sensing the difference between the first bit line and the second bit line.

In accordance with another embodiment of the present invention, a semiconductor device with OTP memory cells includes a first switching unit for transferring a first bias voltage, a first MOS transistor having a first gate coupled to a first gate signal and a first terminal coupled to the first bias voltage by the first switching unit, a second switching unit for coupling a second terminal of the first MOS transistor to a bit line, a third switching unit for transferring the bias voltage, a second MOS transistor having a second gate coupled to the first gate signal and a first coupled to the bias voltage by the third switching unit, and a fourth switching unit for coupling a second terminal of the second MOS transistor to the bit line.

BRIEF DESCRIPTION OF THE DRAWINGS

FIG. 9 is a circuit diagram depicting a state of the OTP cell shown in FIG. 8 after the OTP memory cell shown is programmed;

FIG. 10 is a circuit diagram showing an OTP memory cell in accordance with a still another embodiment of the present invention; and FIG. 11 is a circuit diagram depicting a state of an OTP cell after the OTP memory cell shown in FIG. 10 is programmed.

DESCRIPTION OF SPECIFIC EMBODIMENTS

Figure 1:
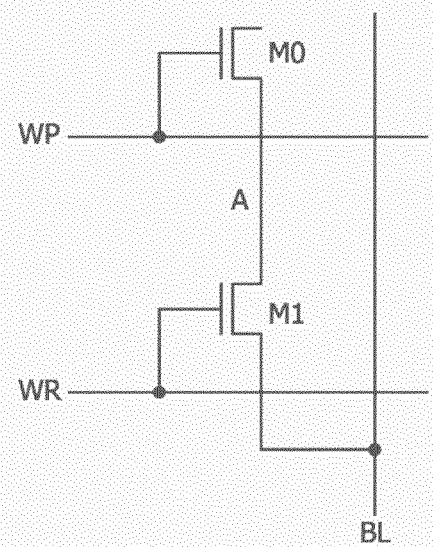
FIG. 1 is a circuit diagram showing a prior art one-time programmable (OTP) memory cell.

Example embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough, and will fully convey a scope of the present invention to those skilled in the art. Throughout the disclosure, like reference numerals refer to like parts throughout the various figures and disclosed embodiments.

The present invention includes an embodiment of a one-time programmable (OTP) memory cell. Herein, it may be that the OTP memory cell can be electronically programmed with data only once; and even though power is no longer supplied, programmed data in the OTP memory cell is retained.

FIG. 1 is a circuit diagram showing a known OTP memory cell.

As shown, the OTP memory cell includes a first MOS transistor M0 and a second MOS transistor M1. A gate of the first MOS transistor M0 is coupled to a first word line WP, and a gate of the second MOS transistor M1 is coupled to a second word line WR. One terminal of the first MOS transistor M0 is floated, and the other terminal is coupled to a resistance node A. Herein, since the one terminal of the first MOS transistor M0 does not have any effect on storing and reading data in the OTP memory cell, the one terminal of the first MOS transistor is floated. One terminal of the second MOS transistor M1 is also coupled to the resistance node A, and the other terminal of the second MOS transistor M1 is coupled to a bit line BL.

Generally, a gate of a MOS transistor is formed by laminating conductive layers on an insulating layer. In programming mode, an insulating layer of the gate of the first MOS transistor M0 is destroyed. The second MOS transistor M1 serves as a switching element in order to select the OTP memory cell.

Figure 2:
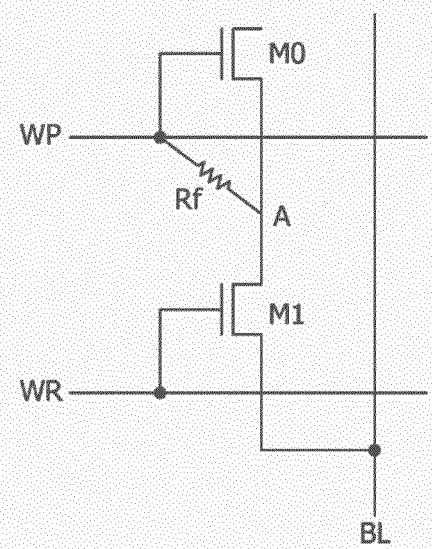
FIG. 2 is a circuit diagram depicting a state of the prior art OTP cell after the OTP memory cell shown in FIG. 1 is programmed.

FIG. 2 is a circuit diagram describing a state of an OTP cell after the OTP memory cell shown in FIG. 1 is programmed. Referring to FIG. 2, a programming mode of the OTP memory cell shown in FIG. 1 is described. The bodies of the first and the second MOS transistors M0 and M1 are coupled to a ground voltage.

The first word line WP is supplied with a high level voltage VPP, and the second world line WR is coupled to a voltage having a lower level than the high level voltage VPP, e.g., a half level voltage (VPP/2). The bit line BL is coupled to ground voltage. Herein, the high level voltage VPP is a voltage having a sufficient level to destroy an insulating layer included in a gate pattern of first MOS transistor M0, which is substantially used as the first word line WP. For example, if it is assumed that a power voltage is 1.2V, a high level voltage VPP might be 6V, i.e., higher level than 1.2V.

Since the gate of second MOS transistor M1 is supplied with a first voltage (VPP/2), the gate is turned on, and then the resistance node A is coupled to ground voltage. The gate of the first MOS transistor M0 is coupled to the high level voltage VPP. Due to a difference of voltage levels supplied to the gate and the one terminal of the first MOS transistor M0, the insulating layer of the first MOS transistor M0 is destroyed, i.e., broken down. When the insulating layer is destroyed, a current path is created between the first word line WP and the resistance node A. There is a resistance Rf in the current path. In this configuration with the first MOS transistor MO coupled to a ground voltage, the insulating may not be reliably and/or consistently destroyed. In order to reliably destroy an insulating layer included in the gate pattern of first MOS transistor M0 during a programming mode, the insulating layer can be formed thinner than those of other transistors. Also, to increase programming reliability, the high level voltage VPP can have a higher voltage level than a predetermined voltage level, where the predetermined voltage level can destroy the insulating layer included in the gate pattern of first MOS transistor M0.

In a read mode, the first word line WP is supplied with a power voltage VDD, and the second word line WR is coupled to the power voltage VDD. The bit line is precharged with a ground voltage level. If the insulating layer included in the gate pattern of first MOS transistor M0 is destroyed (breakdown state), a voltage level of bit line BL rises. A sense amplifier (not shown) coupled to the bit line BL senses a voltage level of the bit line BL. The sense amplifier is configured to compare a reference voltage level with a voltage level of bit line BL and recognize whether the voltage level of the bit line BL has risen to the reference voltage level.

Otherwise, if the insulating layer included in the gate pattern of first MOS transistor M0 is not destroyed, the voltage level of bit line BL does not rise and therefore retains the precharged voltage level. Depending on whether the insulating layer of first MOS transistor M0 is destroyed, the sense amplifier coupled to the bit line BL can sense a voltage level supplied to the bit line BL, and determine which data '0' or '1' is stored in the OTP cell.

A system may have to wait a relatively long time for using data stored in the OTP memory cell. Access time of the OTP memory cell shown in FIGS. 1 and 2 might be about 200 ns. If it is assumed that a system having an operation frequency of 100 MHz is embedded with an OTP memory cell, the system may have to wait long time for using data stored therein. To achieve a real-time read operation, the system additionally needs a buffer memory such as a SRAM or a register.

When an insulating layer is broken down during a programming mode, there is an irregular breakdown point condition in the OTP memory cell shown in FIGS. 1 and 2. When the OTP memory cell is programmed, the body of first MOS transistor M0 is coupled to a ground voltage, one terminal is floated, and the other terminal is coupled to a ground voltage supplied to the resistance node A. Accordingly, it is highly possible that a breakdown point or portion of the insulating layer is located near the resistance node A. But, in some cases, the breakdown portion could be located in a center area of a transistor between the source/drain. Thus, the breakdown point of the insulating layer is not consistent. Because of the random location of the breakdown point, the resistance Rf shown in FIG. 2 may be changed. Thus, when a system is embedded with the above described OTP memory cell, data communication between the system and the OTP memory cell should be designed for the maximum value of resistance Rf to achieve stable data access operation.

As described above, the OTP memory cell shown in FIG. 1 has several limits to reduce data access time. To overcome the above described problem, the present invention provides an OTP memory cell which can access data at high speed.

Figure 3:
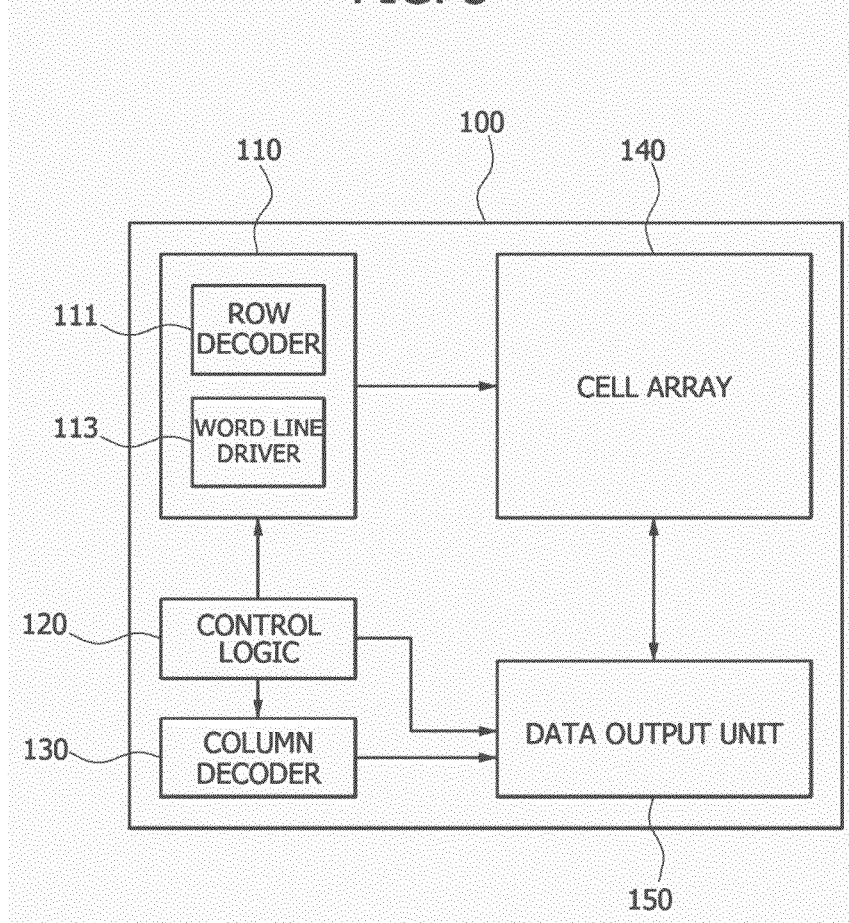
FIG. 3 is a block diagram showing a semiconductor memory device with OTP memory cells in accordance with an embodiment of the present invention.

FIG. 3 is a block diagram showing a semiconductor memory device with OTP memory cells in accordance with an embodiment of the present invention.

As shown, the semiconductor memory device 100 with OTP memory cells includes an address control block 110 having a row decoder 111 and a word line driver 113, a control logic 120, a column decoder 130, a cell array 140, and a data output block 150. In the address control block 110, the row decoder 111 is for decoding a row address, and the word line driver 113 is for controlling a word line selected by the decoding result of the row decoder. The control logic 120 is for controlling the address control block 110, the column decoder 130 and the data output block 150 in response to instructions inputted from external devices. The column decoder 130 is for decoding a column address. The data output block 150 is for outputting some signals from among a plurality of signals provided from the cell array 140, where the output signals are selected based on a column address. The cell array 140 includes a plurality of OTP memory cells.

The semiconductor device shown in FIG. 3 is either used as an independent device, or included in another memory device (s) or semiconductor device as a component. For example, the semiconductor device could be used for either storing trimming information of an integrated circuit, security identification information, chip identification information, calibration data and etc., or storing redundancy information of a main memory block.

Figure 4:
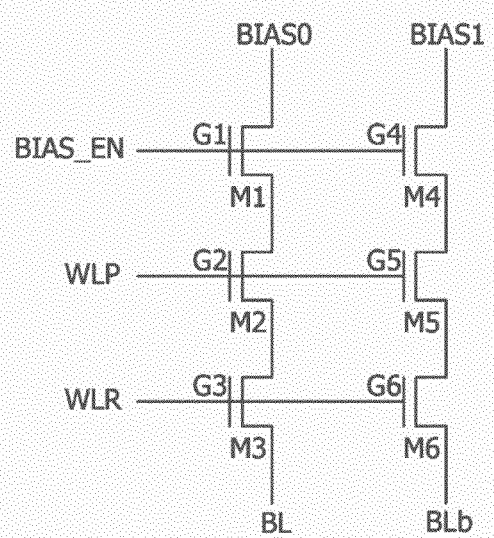
FIG. 4 is a circuit diagram showing an OTP memory cell in accordance with an embodiment of the present invention.
Figure 5:
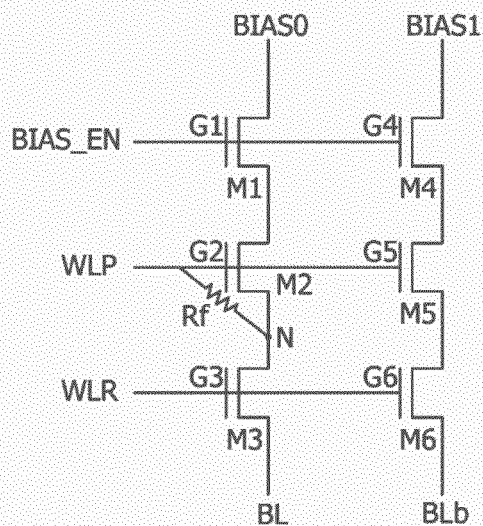
FIG. 5 is a circuit diagram depicting a state of the OTP cell of FIG. 4 after the OTP memory cell is programmed.

FIG. 4 is a circuit diagram showing an OTP memory cell in accordance with an embodiment of the present invention and FIG. 5 is a circuit diagram depicting a state of the OTP memory cell of FIG. 4 after the OTP memory cell is programmed.

As shown, an OTP memory cell includes a first MOS transistor M1 having a first gate G1 coupled to a bias enable signal BIAS_EN and a first terminal coupled to a first bias voltage BIAS0, a second MOS transistor M2 having a second gate G2 coupled to a first gate signal WLP and a first terminal coupled to a second terminal of the first MOS transistor M1, and a third MOS transistor M3 having a third gate G3 coupled to a second gate signal WLR and a first terminal coupled to a second terminal of the second MOS transistor M2. In an embodiment, a first switching unit may comprise the first MOS transistor M1, and the first switching unit may be configured to transfer the first bias voltage BIAS0 to the first terminal of the second MOS transistor M2. In an embodiment, a second switching unit may comprise the third MOS transistor M3, and the second switching unit may be configured to couple the second terminal of the second MOS transistor M2 to a bit line BL. Three MOS transistors M1, M2, and M3 constitute one OTP memory cell. In program mode, an insulating layer of the second gate G2 is broken.

Another OTP memory cell includes a fourth MOS transistor M4 having a fourth gate G4 coupled to the bias enable signal BIAS_EN and a first terminal coupled to a second bias voltage BIAS1, a fifth MOS transistor M5 having a fifth gate G5 coupled to the first gate signal WLP and one terminal coupled to a second terminal of the fourth MOS transistor M4, and a sixth MOS transistor M6 having a sixth gate G6 coupled to a second gate signal WLR and a first terminal coupled to a second terminal of the fifth MOS transistor M5. In an embodiment, a third switching unit may comprise the fourth MOS transistor M4, and the third switching unit may be configured to transfer the second bias voltage BIAS1 to the first terminal of the fifth MOS transistor M5. In an embodiment, a fourth switching unit may comprise the sixth MOS transistor M6, and the fourth switching unit may be configured to couple the second terminal of the fifth transistor M5 to a bit line BLb.

In the program mode, the bias voltages BIAS0 and BIAS1 have a predetermined voltage. A first gate signal WLP has a higher voltage than a first bias voltage BIAS0 in order to break down the insulating layer of the second gate G2 and/or the fifth gate G5. The bias enable signal BIAS_EN has a voltage to turn on the first transistor M1 and the fourth transistor M4, and the second gate signal WLR has a voltage to turn on the third transistor M3 and the sixth transistor M6. When the first transistor M1 is turned on by the bias enable signal BIAS_EN, the first switching unit may transfer the first bias voltage BIAS0 to the second terminal of the second transistor M2. Similarly, when the fourth transistor M4 is turned on by the bias enable signal BIAS_EN, the fourth switching unit may transfer the second bias voltage BIAS1 to the second terminal of the fifth transistor M5. If the insulating layer of the second gate G2 is broken, a current path with resistance 'Rf' is formed between the second gate G2 and the one terminal of the second transistor M2 (Referring to 'Rf' shown in FIG. 5).

Figure 6:
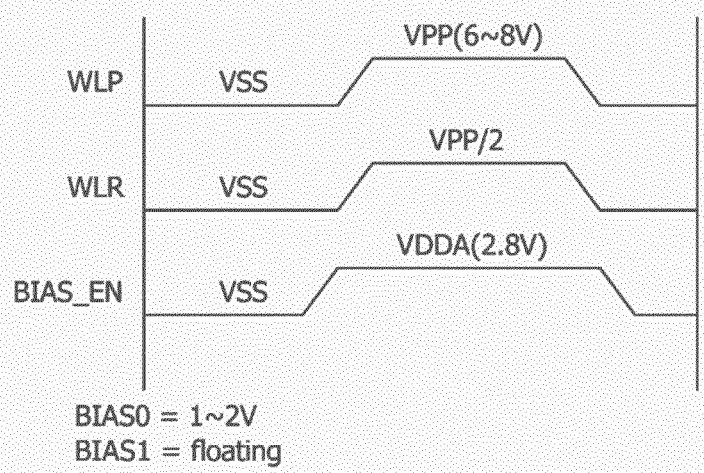
FIG. 6 is a timing diagram depicting an operation voltage supplied during a programming mode of the OTP memory cell shown in FIG. 4.
Figure 7:
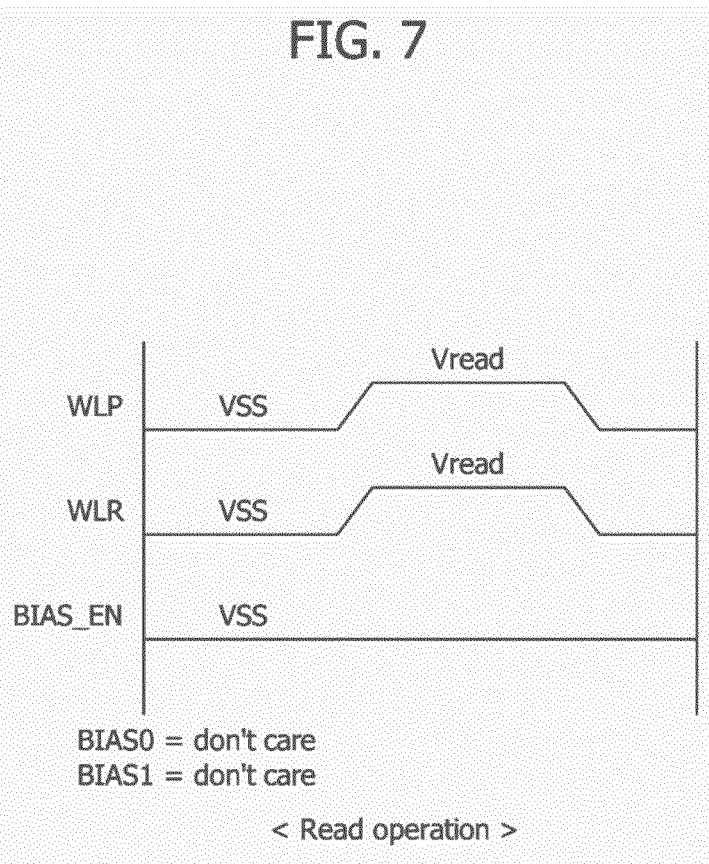
FIG. 7 is a timing diagram depicting an operation voltage supplied during a read mode of the OTP memory cell shown in FIG. 4.

FIGS. 6 and 7 depict operating waveforms for the OTP memory cell shown in FIG. 4. FIG. 6 is a timing diagram depicting an operation voltage supplied during a programming mode of the OTP memory cell shown in FIG. 4, FIG. 7 is a timing diagram describing an operation voltage supplied during a read mode of the OTP memory cell shown in FIG. 4.

As shown in FIG. 6, the first bias voltage BIAS0 has for example a voltage in the range of about 1V to about 2V and the second bias voltage BIAS1 is on a floating state. The first gate signal WLP has a voltage in the range of about 6V to about 8V as a high voltage, and the second gate signal WLR has a voltage level that is half the high voltage level. The bias enable signal BIAS_EN has 2.8V and the bit lines BL and BLb have a ground voltage.

A gate of a MOS transistor includes an insulating layer and a conductive layer on the insulating layer. If a high voltage VPP is provided to both terminals of the insulating layer of the MOS transistor M2, the insulating layer of the MOS transistor M2 could be broken down. However, if a half voltage of the high voltage VPP is provided to the insulating layer of the MOS transistor M2, the insulating layer of the MOS transistor M2 could not be broken down.

A predetermined bias voltage BIAS is provided to the other terminal of the first MOS transistor M1 and the second MOS transistor M2 to help break down the insulating layers of the second MOS transistor M2. The bias voltage BIAS might be lower than the high voltage VPP. For example, if power voltage is 1.2V, the high voltage may be in the range of about 6V to about 8V and the bias voltage BIAS may be in the range of about 1-2V. The high voltage VPP is a voltage for breaking down an insulating layer of a MOS transistor and may be desirably higher by 10-20% than a breakdown voltage of the insulating layer.

FIG. 7 is a timing diagram describing an operation voltage supplied during a read mode of the OTP memory cell shown in FIG. 4.

As shown, in the read mode, the first and second gate signals WLP and WLR have a turn-on voltage to turn on the MOS transistors G2 and G5, and G3 and G6 respectively. The bias enable signal BIAS_EN has a ground voltage. The bit lines BL and BLb have a precharge voltage 0V. The bias voltages BIAS0 and BIAS1 can have any voltage and is in a floating state here.

If the insulating layer of the gate G2 is broken down, a current path between the gate G2 and the bit line BL and the voltage of the bit line BL increases. If the insulating layer of the gate G5 is not broken down, the voltage of the bit line BLb does not increase and thus, there is no current path between the gate G5 and the bit line BLb. Data can be read depending on whether there is current on the bit lines BL or BLb. For instance, if the voltage of the bit line BL increases because of the breakdown of the insulating layer of the gate G2, data '1' can be determined and otherwise if the data '0' can be determined. That is, if the insulating layer breaks down, the bit line BL may have a logic level of '1'; if the insulating layer does not break down, the bit line BL may have a logic level of '0'.

The OTP memory cell in accordance with an embodiment of the present invention is characterized in that a bias voltage BIAS0 or BIAS1 is provided to an OTP memory cell which may be a MOS transistor. When the high level voltage VPP is supplied to the gate of the second MOS transistor M2, if the bias voltage BIAS0 or BIAS1 is inputted to the first terminal of the first MOS transistor M1, a current flows through the second terminal of the first MOS transistor MA to the first terminal of the second MOS transistor M2. Hot carriers are are generated in a channel area of the second MOS transistor M2, and electrons in the channel area are injected into the second gate G2. The injected electrons having high energy can generate holes having corresponding high energy in the gate G2. The generated holes move into the channel area by a tunneling effect. At this time, the generated holes can aid the breakdown of the gate G2 insulating layer. These mechanisms help the insulating layer of the gate G2 break down. Thus, a time for breaking down the gate G2 insulating layer can be reduced due to those mechanisms.

Further, because of the generated holes, a breakdown portion of the insulating layer of the gate G2 can be located on the end of channel area, i.e., close to one of a source or drain region of the second MOS transistor M2. Since the breakdown portion can be more regularly pointed, a resistance Rf generated by the breakdown of the insulating layer of the gate G2 can be decreased up to the minimum value. If the resistances Rf in plural OTP memory cells can be set to a regular distribution, a time needed for changing a voltage level of the bit line BL can be decreased more regularly in a read mode. As the speed to change a voltage level of the bit line BL is faster, data access time of the OTP memory cells can be reduced. As compared with the OTP memory cell shown in FIG. 1, the data access time of an OTP memory cell according to an embodiment of the present invention is dramatically decreased. Thus, additional buffer memories, which may be needed to overcome an access speed gap between an OTP cell and a device receiving data from the OTP cell, are not required. As a result, efficiency of a system which is embedded with the OTP memory cell according to the embodiment is increased.

Figure 8:
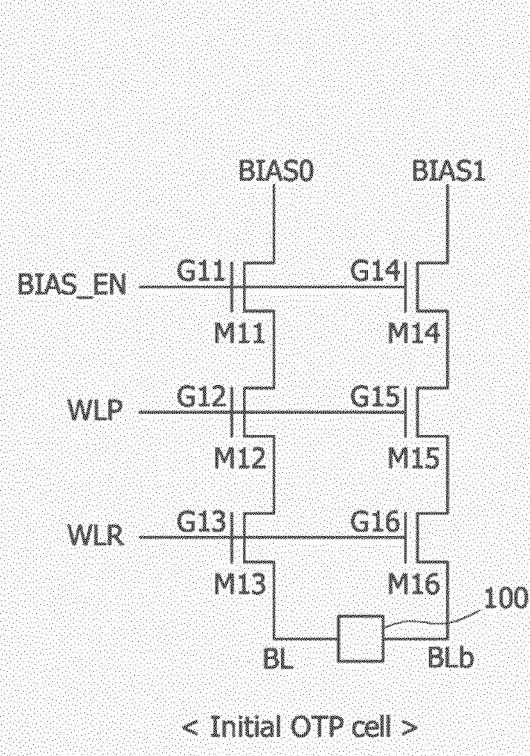
FIG. 8 is a circuit diagram showing an OTP memory cell in accordance with another embodiment of the present invention.

FIG. 8 is a circuit diagram showing an OTP memory cell in accordance with another embodiment of the present invention and FIG. 9 is a circuit diagram describing a status after the OTP memory cell shown in FIG. 8 is programmed.

As shown, an OTP memory cell includes a first MOS transistor M11 having a first gate G11 coupled to a bias enable signal BIAS_EN and first terminal coupled to a first bias voltage BIAS0, a second MOS transistor M12 having a second gate G12 coupled to a first gate signal WLP and first terminal coupled to the other terminal of the first MOS transistor M11, and a third MOS transistor M13 having a third gate G13 coupled to a second gate signal WLR and a first terminal coupled to a second terminal of the second MOS transistor M15. In an embodiment, a first switching unit may comprise the first MOS transistor M11, and the first switching unit may be configured to transfer the first bias voltage BIAS0 to the first terminal of the second MOS transistor M12. In an embodiment, a second switching unit may comprise the third MOS transistor M13, and the second switching unit may be configured to couple the second terminal of the second MOS transistor M12 to a bit line BL.

The OTP memory cell also includes a fourth MOS transistor M14 having a fourth gate G14 coupled to a bias enable signal BIAS_EN and a first terminal coupled to a second bias voltage BIAS1, a fifth MOS transistor M15 having a fifth gate G15 coupled to a first gate signal WLP and a first terminal coupled to a second terminal of the fourth MOS transistor M14, a sixth MOS transistor M16 having a sixth gate G16 coupled to a second gate signal WLR and a first terminal coupled to a second terminal of the fifth MOS transistor M13, and a sense amplifier 100 for sensing the voltage levels of the bit lines BL and BLb. In an embodiment, a third switching unit may comprise the fourth MOS transistor M14, and the third switching unit may be configured to transfer the second bias voltage BIAS1 to the first terminal of the fifth MOS transistor M15. In an embodiment, a fourth switching unit may comprise the sixth MOS transistor M16, and the fourth switching unit may be configured to couple the second terminal of the fifth transistor M15 to a bit line BLb.

Six MOS transistors M11 to M16 constitute one OTP memory cell in accordance with an embodiment of the present invention. In the program mode, an insulating layer of the gate G12 or G15 can be broken. One OTP memory cell can store data by breaking an insulating layer of the gate G12 or G15 down. Herein, there will be explained regarding a case when the insulating layer of the gate G12 is broken down.

In program mode, the bias voltages BIAS0 and BIAS1 have a predetermined voltage, for example in the range of 1 v to 2 v. The first gate signal WLP has a higher voltage than a first bias voltage BIAS0 in order to break down the insulating layer of the second gate G12. The bias enable signal BIAS_EN has a voltage to turn on the first transistor M11 and the fourth transistor M14, and the second gate signal WLR has a voltage to turn on the third transistor M13 and the sixth transistor M16. When the first transistor M11 is turned on by the bias enable signal BIAS_EN, the first switching unit may transfer the first bias voltage BIAS0 to the second terminal of the second transistor M12. Similarly, when the fourth transistor M14 is turned on by the bias enable signal BIAS_EN, the fourth switching unit may transfer the second bias voltage BIAS1 to the second terminal of the fifth transistor M5. The bit line BL has the ground voltage and the bit line BLb has a voltage not to break down the insulating layer of the second gate G15. The bias voltage BIAS1 is in a floating state. Herein, a turn-on voltage for MOS transistors may be the half of the high voltage VPP. Hot carriers are generated in a channel area corresponding to the gate G12 caused by the bias voltage BIAS0 and the first gate signal WLP. The hot carriers make the insulating layer of the second gate G12 break down. If the insulating layer of the second gate G12 is broken, a current path is formed between the second gate G12 and the second terminal of the second transistor M12. Shown in FIG. 9, in program mode, a resistance Rf is formed.

In the read mode, the first and second gate signals WLP and WLR have a turn-on voltage to turn on the MOS transistors M12 and M15, and M13 and M16 respectively. The bias enable signal BIAS_EN has a turn-off voltage to turn-off the MOS transistors M11 and M14. Due to the resistance Rf, the voltage of the bit line BL increases and the voltage of the BLb does not increase. The bias voltages BIAS0 and BIAS1 may have any voltage and is in a floating state here.

The sense amplifier 100 senses the voltage difference between the bit lines BL and BLb and a data according to the sensing result is accessed. The bit lines BL and BLb may be precharged before a data read operation.

FIG. 10 is a circuit diagram showing an OTP memory cell in accordance with still another embodiment of the present invention and FIG. 11 is a circuit diagram depicting a state of the OTP memory cell shown in FIG. 10 after the OTP memory cell is programmed.

As shown, an OTP memory cell includes a first MOS transistor M21 having a first gate G21 coupled to a bias enable signal BIAS_EN and a first terminal coupled to a bias voltage BIAS0, a second MOS transistor M22 having a second gate G22 coupled to a first gate signal WLP and a first terminal coupled to a second terminal of the first MOS transistor M21, and a third MOS transistor M23 having a third gate G23 coupled to a second gate signal WLR and a first terminal coupled to a second terminal of the second MOS transistor M22. In an embodiment, a first switching unit may comprise the first MOS transistor M21, and the first switching unit may be configured to transfer the bias voltage BIAS0 to the first terminal of the second MOS transistor M22. In an embodiment, a second switching unit may comprise the third MOS transistor M23, and the second switching unit may be configured to couple the second terminal of the second MOS transistor M22 to a bit line BL.

The OTP memory cell also includes a fourth MOS transistor M24 having a fourth gate G24 coupled to the bias enable signal BIAS_EN and a first terminal coupled to the bias voltage BIAS0, a fifth MOS transistor M25 having a fifth gate G25 coupled to the first gate signal WLP and a first terminal coupled to a second terminal of the fourth MOS transistor M24, and a sixth MOS transistor M26 having a sixth gate G26 coupled to the second gate signal WLR and a first terminal coupled to a second terminal of the fifth MOS transistor M25. In an embodiment, a third switching unit may comprise the fourth MOS transistor M24, and the third switching unit may be configured to transfer the bias voltage BIAS0 to the first terminal of the fifth MOS transistor M25. In an embodiment, a fourth switching unit may comprise the sixth MOS transistor M26, and the fourth switching unit may be configured to couple the second terminal of the fifth transistor M25 to a bit line BLb.

Six MOS transistors M21 to M26 constitute one OTP memory cell in accordance with a described embodiment of the present invention. In program mode, an insulating layer of the gate G22 or G25 can be broken. One OTP memory cell can store data by breaking down an insulating layer of the gate G22 or G25. Herein, there will be explained regarding a case when the insulating layer of the gate G22 is broken down.

In program mode, the bias voltage BIAS0 has a predetermined voltage, for example in the range of 1 v to 2 v. A first gate signal WLP has a higher voltage than the bias voltage BIAS0 in order to break down the insulating layer of the second gate G22. The bias enable signal BIAS_EN has a voltage to turn on the first transistor M21 and the fourth transistor M24. When the first transistor M21 is turned on by the bias enable signal BIAS_EN, the first switching unit may transfer the bias voltage BIAS0 to the second terminal of the second transistor M22. Similarly, when the fourth transistor M24 is turned on by the bias enable signal BIAS_EN, the fourth switching unit may transfer the bias voltage BIAS0 to the second terminal of the fifth transistor M5. The second gate signal WLR has a voltage to turn on the third transistor M23 and the sixth transistor M26. The bit line has the ground voltage. Herein, a turn-on voltage for MOS transistors may be the half of the high voltage VPP. Hot carriers are generated in a channel area corresponding to the gate G22 caused by a difference between the bias voltage BIAS0 and the first gate signal WLP. The hot carriers make the insulating layer of the second gate G22 break down. If the insulating layer of the second gate G22 is broken, a current path is formed between the second gate G22 and the second terminal of the second transistor M22. Shown in FIG. 22, in program mode, a resistor Rf is formed in the current path.

In the read mode, the first and second gate signals WLP and WLR have a turn-on voltage to turn on the MOS transistors M22 and M25, and M23 and M26 respectively. The bias enable signal BIAS_EN has a turn-off voltage to turn-off the MOS transistors M21 and M24. Due to the resistor Rf, the voltage of the bit line BL increases. Data can be determined based on whether there is a voltage on the bit lines BL or not. For instance, if the voltage of the bit line BL increase because of the resistor Rf, data '1' can be determined and otherwise data '0' can be determined. The bias voltage BIAS0 may have any voltage and is in a floating state here. The bit lines BL and BLb may be precharged before a data read operation.

In accordance with an embodiment of the present invention, one OTP memory cell has six MOS transistors M21~M26 and especially, two gates G22 and G25 of two MOS transistors M22 and M25 are arranged in parallel. In program mode, one or both of the insulating layers of two gates G22 and G25 are broken down which make reliability of the program operation enhance. Generally, an insulating layer of a gate has various characteristics depending on a semiconductor process. However, in program mode, breaking down at least one of the two insulating layers can enhance the reliability of the program operation.

In another case, more than six MOS transistors can constitute one OTP memory cell. For instance, nine MOS transistors can constitute one OTP memory cell and three MOS transistors may constitute a row in this case.

As described above, in embodiments of the present invention, it is possible to readily implement one-time programmable (OTP) memory cells which can be accessed at high speed.

While the present invention has been described with respect to the specific embodiments, it will be apparent to those skilled in the art that various changes and modifications may be made without departing from the spirit and scope of the invention as defined in the following claims.

What is claimed is:

1. A semiconductor device including an OTP memory cell, comprising:
   a first switching unit for transferring a first bias voltage in response to a bias enable signal;
   a first MOS transistor having a first gate coupled to a first gate signal and a first terminal coupled to the first bias voltage by the first switching unit; and
   a second switching unit for coupling a second terminal of the first MOS transistor to a first bit line in response to a second gate signal,
   wherein, in a programming mode, the first bias voltage is supplied with a predetermined level, the first gate of the first MOS transistor is supplied with a high level voltage having a higher level than the first bias voltage to break down an insulating layer of the first gate, and the second gate signal and the bias enable signal have a turn-on voltage to turn on the first and second switching unit respectively.

2. The semiconductor device as recited in claim 1, wherein the first switching unit includes a second MOS transistor having a second gate coupled to the bias enable signal and configured to provide the first bias voltage to the first terminal of the first MOS transistor.

3. The semiconductor device as recited in claim 2, wherein the second switching unit includes a third MOS transistor having a third gate coupled to the second gate signal, a first terminal coupled to the second terminal of the first MOS transistor, and a second terminal coupled to the bit line.

4. The semiconductor device as recited in claim 2, further comprising:
   a third switching unit for transferring a second bias voltage;
   a fourth MOS transistor having a fourth gate coupled to the first gate signal and a first terminal coupled to the second bias voltage by the third switching unit; and
   a fourth switching unit for coupling a second terminal of the fourth MOS transistor to a second bit line.

5. The semiconductor device as recited in claim 4, wherein the third switching unit includes a fifth MOS transistor having a fifth gate coupled to the bias enable signal and configured to provide the second bias voltage to the first terminal of the fourth MOS transistor, and
   the fourth switching unit includes a sixth MOS transistor having a sixth gate coupled to the second gate signal, a first terminal coupled to the second terminal of the fourth MOS transistor, and a second terminal coupled to the second bit line.

6. The semiconductor device as recited in claim 1, wherein, in the programming mode, hot carriers are generated in a channel area corresponding to the first gate of the first MOS transistor where the hot carriers are caused by the first bias voltage and the high level voltage.

7. The semiconductor device as recited in claim 6, wherein the turn-on voltage is half the level of the high level voltage.

8. The semiconductor device as recited in claim 1, wherein, in a read mode, the first bias voltage has a ground voltage and the first and second gate signal has a turn-on voltage to turn on the first MOS transistor and the second switching unit.

9. A semiconductor device with OTP memory cells, comprising:
a first switching unit for transferring a first bias voltage in response to a bias enable signal;
a first MOS transistor having a first gate coupled to a first gate signal and a first terminal coupled to the first bias voltage by the first switching unit;
a second switching unit for coupling a second terminal of the first MOS transistor to a first bit line in response to a second gate signal;
a third switching unit for transferring a second bias voltage;
a second MOS transistor having a second gate coupled to the first gate signal and a first terminal coupled to the second bias voltage by the third switching unit;
a fourth switching unit for coupling a second terminal of the second MOS transistor to a second bit line; and
a sense amplifier for sensing the difference between the first bit line and the second bit line,
wherein, in a programming mode, the first bias voltage is supplied with a predetermined level, the first gate of the first MOS transistor is supplied with a high level voltage having a higher level than the first bias voltage to break down an insulating layer of the first gate, and the second gate signal and the bias enable signal have a turn-on voltage to turn on the first and second switching unit respectively.

10. The semiconductor device as recited in claim 9, wherein the first switching unit includes a third MOS transistor having a third gate coupled to the bias enable signal and configured to provide the first bias voltage to the first terminal of the first MOS transistor, and
the second switching unit includes a fourth MOS transistor having a fourth gate coupled to the second gate signal, a first terminal coupled to the second terminal of the first MOS transistor, and a second terminal coupled to the first bit line.

11. The semiconductor device as recited in claim 10, wherein the third switching unit includes a fifth MOS transistor having a fifth gate coupled to the bias enable signal and configured to provide the second bias voltage to the first terminal of the second MOS transistor, and
the fourth switching unit includes a sixth MOS transistor having a sixth gate coupled to the second gate signal, a first terminal coupled to the second terminal of the second MOS transistor, and a second terminal coupled to the second bit line.

12. The semiconductor device as recited in claim 9, wherein in a program mode, the insulating layer of the first gate or an insulating layer of the second gate is broken down.

13. The semiconductor device as recited in claim 9, wherein, in the programming mode, hot carriers are generated by the first bias voltage and the high level voltage in a channel area corresponding to the first gate or the second gate.

14. The semiconductor device as recited in claim 9, wherein the turn-on voltage level is half the high level voltage.

15. The semiconductor device as recited in claim 14, wherein, in a read mode, the first bias voltage has a ground voltage, the first gate signal have the turn-on voltage to turn on the first and second MOS transistors, and second gate signal have the turn-on voltage to turn on the second and fourth switching units.

16. A semiconductor device with OTP memory cells, comprising:
a first switching unit for transferring a bias voltage in response to a bias enable signal;
a first MOS transistor having a first gate coupled to a first gate signal and a first terminal coupled to the bias voltage by the first switching unit;
a second switching unit for coupling a second terminal of the first MOS transistor to a bit line in response to a second gate signal;
a third switching unit for transferring the bias voltage in response to the bias enable signal;
a second MOS transistor having a second gate coupled to the first gate signal and a first terminal coupled to the bias voltage by the third switching unit; and
a fourth switching unit for coupling a second terminal of the second MOS transistor to the bit line in response to the second gate signal,
wherein, in a programming mode, the bias voltage is supplied with a predetermined level, the first gate of the first MOS transistor is supplied with a high level voltage having a higher level than the bias voltage to break down insulating layer of the first gate or the second gate, the second gate signal have a turn-on voltage to turn on the first and third switching units, and the bias enable signal have the turn-on voltage to turn on the second and fourth switching units.

17. The semiconductor device as recited in claim 16, wherein the first switching unit includes a third MOS transistor having a third gate coupled to the bias enable signal and configured to provide the bias voltage to the first terminal of the first MOS transistor, and
the second switching unit includes a fourth MOS transistor having a fourth gate coupled to the second gate signal, a first terminal coupled to the second terminal of the first MOS transistor, and a second terminal coupled to the bit line.

18. The semiconductor device as recited in claim 17, wherein the third switching unit includes a fifth MOS transistor having a fifth gate coupled to the bias enable signal and configured to provide the bias voltage to the first terminal of the second MOS transistor, and
the fourth switching unit includes a sixth MOS transistor having a sixth gate coupled to the second gate signal, a first terminal coupled to the second terminal of the second MOS transistor, and a second terminal coupled to the bit line.

19. The semiconductor device as recited in claim 16, wherein, in the programming mode, hot carriers are generated by the bias voltage and the high level voltage in a channel area corresponding to the first gate or the second gate.

20. The semiconductor device as recited in claim 16, wherein the turn-on voltage level is half the high level voltage.

21. The semiconductor device as recited in claim 16, wherein, in a read mode, the bias voltage has a ground voltage, the first gate signal has the turn-on voltage to turn on the first and second MOS transistors, and second gate signal has the turn-on voltage to turn on the second and fourth switching units.

* * * * *